United States Patent
Babinetz (10) Patent No.: US 7,464,854 B2
(45) Date of Patent: Dec. 16, 2008

(54) METHOD AND APPARATUS FOR FORMING A LOW PROFILE WIRE LOOP

(75) Inventor: Stephen E Babinetz, Lansdale, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 417 days.

(21) Appl. No.: 11/306,678

(22) Filed: Jan. 6, 2006

(65) Prior Publication Data

US 2006/0163331 A1    Jul. 27, 2006

Related U.S. Application Data

(60) Provisional application No. 60/646,950, filed on Jan. 25, 2005.

(51) Int. Cl.
*H01L 23/48* (2006.01)

(52) U.S. Cl. ............... 228/180.5; 257/638; 428/617

(58) Field of Classification Search .......... 228/180.5; 438/617; 257/784
See application file for complete search history.

(56) References Cited

U.S. PATENT DOCUMENTS

| | | | |
|---|---|---|---|
| 4,445,633 A | 5/1984 | Bonham | |
| 5,192,018 A * | 3/1993 | Terakado et al. | 228/179.1 |
| 5,205,463 A | 4/1993 | Holdgrafter | |
| 6,062,462 A | 5/2000 | Gillotti | |
| 6,156,990 A | 12/2000 | Ellis | |
| 6,315,190 B1 * | 11/2001 | Nishiura | 228/180.5 |
| 6,815,836 B2 | 11/2004 | Ano | |
| 6,933,608 B2 | 8/2005 | Fujisawa | |
| 7,229,906 B2 | 6/2007 | Babinetz et al. | |
| 2002/0079348 A1 | 6/2002 | Kimura et al. | |
| 2004/0148773 A1 | 8/2004 | Beaman et al. | |
| 2004/0152292 A1 | 8/2004 | Babinetz | |
| 2005/0072833 A1 | 4/2005 | Wong et al. | |
| 2005/0109819 A1 | 5/2005 | Qin et al. | |

FOREIGN PATENT DOCUMENTS

| | | |
|---|---|---|
| JP | 03142941 A | 6/1991 |
| JP | 07130785 A | 5/1995 |
| JP | 9051011 | 2/1997 |
| JP | 11219970 A | 8/1999 |

* cited by examiner

*Primary Examiner*—Kiley Stoner
*Assistant Examiner*—Nicholas P D'Aniello
(74) *Attorney, Agent, or Firm*—Christopher M. Spletzer, Sr.

(57) ABSTRACT

A method of bonding a wire between a first bonding location and a second bonding location is provided. The method includes bonding a first end of a wire to a first bonding location using a wire bonding tool to form a first wire bond. The method also includes forming a looped portion in the wire adjacent the first wire bond. The method also includes lowering the wire bonding tool in a direction towards the first wire bond after the forming step. The lowering step is interrupted prior to the wire bonding tool contacting the first wire bond. The method also includes bonding a second end of the wire to a second bonding location.

14 Claims, 8 Drawing Sheets

METHOD AND APPARATUS FOR FORMING A LOW PROFILE WIRE LOOP

CROSS-REFERENCE TO RELATED APPLICATIONS

This application claims the benefit of U.S. Provisional Application No. 60/646,950, filed Jan. 25, 2005, the contents of which are incorporated herein by reference.

FIELD OF THE INVENTION

The present invention relates to wire bonding of semiconductor devices, and more particularly, to providing a low profile wire loop in connection with the wire bonding of semiconductor devices.

BACKGROUND OF THE INVENTION

In the manufacturer of various semiconductor devices, wire bonding techniques are often used to connect components in the devices. For example, wire bonds are often used to provide interconnection between a die and contacts on a leadframe. An exemplary conventional wire bonding operation involves (1) bonding to a first bonding location on a die (e.g., using ball bonding), (2) extending a wire toward a second bonding location on a leadframe, (3) bonding the end of the extended wire to the second bonding location, and (4) cutting the wire.

There is continuous pressure in the semiconductor industry to reduce the size of components, and also to increase the number of wire bonds per unit area. Thus, various techniques exist to reduce the profile or height of wire bonds between components in semiconductor devices. One such technique involves "crushing" (e.g., using a capillary tool) a wire loop on top of the first bonding location (e.g., a die) after depositing a wire ball on the first bonding location. After the wire is crushed on top of the wire ball, the wire is then extended toward, and bonded to, the second bonding location.

This "crushing" technique may provide relatively low profile wire loops; however, this technique also suffers from a number of deficiencies. For example, because the wire is crushed, there are certain points of weakness in the wire, primarily in the region just downstream of the crushed portion. This weakness may result in unsatisfactory and inconsistent pull values in a number of applications.

Thus, it would be desirable to provide a method and apparatus for providing low profile wire bonds while overcoming certain of the deficiencies related to conventional techniques.

SUMMARY OF THE INVENTION

According to an exemplary embodiment of the present invention, a method of bonding a wire between a first bonding location and a second bonding location is provided. The method includes bonding a first end of a wire to a first bonding location using a wire bonding tool to form a first wire bond. The method also includes forming a looped portion in the wire adjacent the first wire bond. The method also includes lowering the wire bonding tool in a direction towards the first wire bond after the forming step. The lowering step is interrupted prior to the wire bonding tool contacting the first wire bond. The method also includes bonding a second end of the wire to a second bonding location.

According to another exemplary embodiment of the present invention, another method of bonding a wire between a first bonding location and a second bonding location is provided. The method includes bonding a first end of a wire to a first bonding location using a wire bonding tool to form a first wire bond. The method also includes forming a looped portion in the wire adjacent the first wire bond. The step of forming includes raising the wire bonding tool above the first wire bond, moving the wire bonding tool away from the first wire bond, raising the wire bonding tool, and moving the wire bonding tool towards the first wire bond. The moving step is interrupted prior to the wire bonding tool contacting the first wire bond. The method also includes bonding a second end of the wire to a second bonding location.

The method of the present invention may also be embodied as an apparatus (e.g., as part of the intelligence of a wire bonding machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

U.S. Pat. Nos. 5,205,463, 6,062,462, and 6,156,990, as well as U.S. Patent Publication No. 2004/0152292, relate to wire bonding technology, and are herein incorporated by reference in their entirety.

As used herein, the term "looped portion" refers to any bend, curve, hook, hump, or fold formed in a wire to be bonded between a first bonding location and a second bonding location. The two ends of a "looped portion" according to the present invention do not necessarily extend towards one another. Exemplary "looped portions" are illustrated in the accompanying figures.

The present invention relates to a method and system for producing low-profile wire loops for use in wire bonding. In certain embodiments of the present invention, after a wire bond is formed at a first bonding location, a looped portion is formed in the wire. After the looped portion is formed, a wire bonding tool (e.g., a capillary tool) used to form the looped portion is lowered towards (or at least in the general direction of) the site of the wire bond. This downward motion of the wire bonding tool is stopped before the tool contacts the wire bond, and as such, potential weakness in the wire caused by such contact (or crushing of the wire to the wire bond) is substantially eliminated. Subsequently, a second end of the wire is bonded to a second bonding location to complete the wire bonding operation.

Thus, according to the present invention, a loop shape (or a hump shape, hook shape, etc.) is formed in a bonding wire without crushing the wire upon itself using a wire bonding tool. The loop shape may be formed directly above a first wire bond, or may be formed to either side of the first wire bond. The loop shape desirably acts to minimize certain stresses on the wire, thereby reducing "neck" damage caused by further shaping or pulling on the wire. This is particularly desirable in thin/overhang die applications where die deflection (i.e., vertical movement) during the wire bonding operation may cause erratic or inconsistent pull test and looping results.

Further, in contrast to conventional crushed loop wire bonding operations, a looped portion according to the present invention is not necessarily formed directly above the first wire bond. By looping the wire away from the first wire bond (i.e., the "Fold Distance" described below is greater than zero), a reduced profile is obtained.

Figure 1:
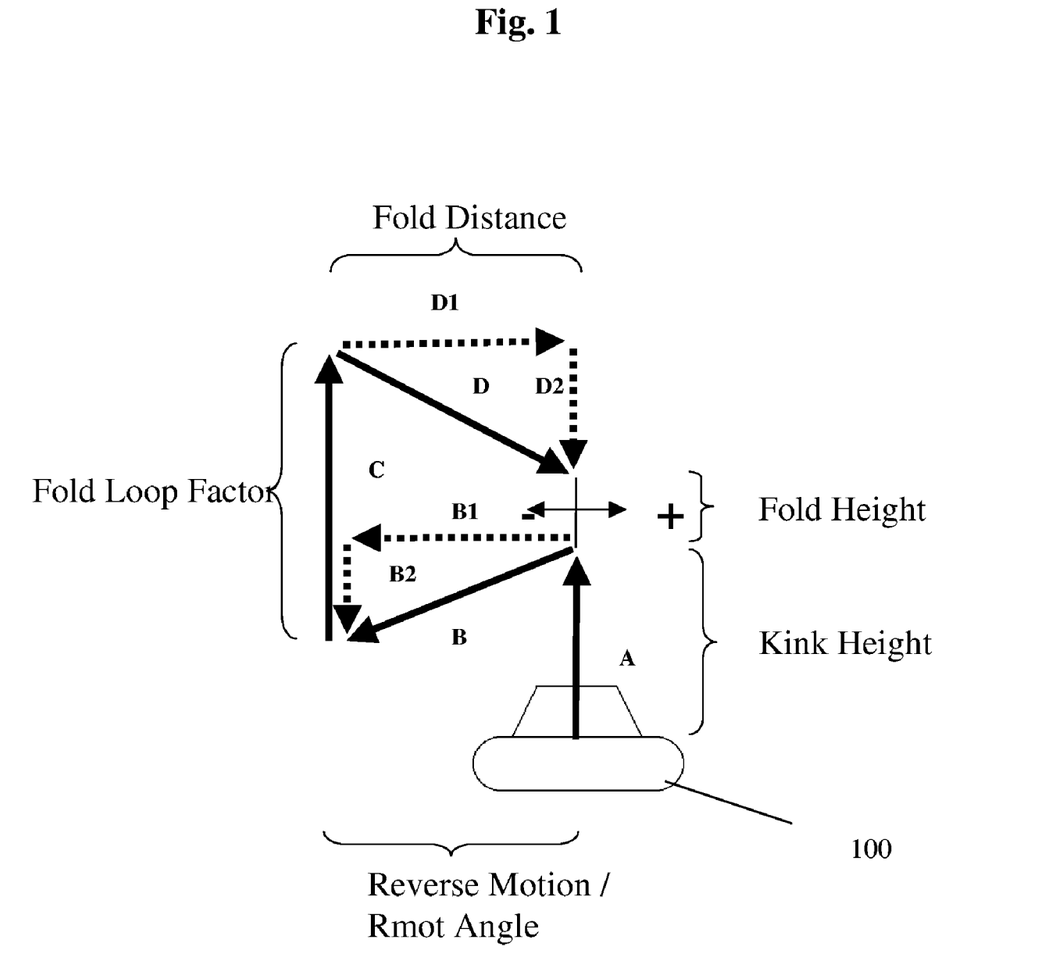
FIG. 1 illustrates techniques for forming low profile wire loops in accordance with various exemplary embodiments of the present invention.

FIG. 1 illustrates various motions used in connection with forming low profile wire loops in accordance with the present invention. More specifically, FIG. 1 illustrates wire bump 100 (e.g., a bump formed by ball bonding). After wire bump 100 is formed (e.g., on a die which is not shown), the wire connected to wire bump 100 is looped in one of a number ways (a plurality of which are described below with reference to FIG. 1), and the wire is thereafter bonded to a second bonding location (e.g., a leadframe).

FIG. 1 illustrates various different combinations of motions (i.e., motion of a wire bonding tool such as a capillary tool) for forming the looped portion. More specifically, after a first end of a wire is bonded to a first bonding location using a wire bonding tool (e.g., first wire bond 100), a looped portion is formed in the wire adjacent first wire bond 100. The looped portion is formed by a combination of motions. A first combination of motions illustrated in FIG. 1 is shown in solid lines and includes motions A, B, C, and D. A second combination of motions is shown in solid and dashed lines and includes A, B1, B2, C, D1, and D2. For example, a user of a wire bonding machine may select either of these first and second combinations of motions (or other combinations of motions within the scope of the present invention) while exercising loop control in order to form the desired loop shape.

Regarding the first combination of motions, the wire bonding tool is raised above first wire bond 100 at step A. At step B, the wire bonding tool is moved along a downward angle away from first wire bond 100. Subsequently, the wire bonding tool is raised at step C, and then the wire bonding tool is moved along another downward angle substantially towards first wire bond 100 at step D. At step D, the motion along the downward angle is interrupted prior to the wire bonding tool contacting first wire bond 100. Following step D, a second end of the wire is bonded to a second bonding location (not shown in FIG. 1).

Regarding the second combination of motions, the wire bonding tool is again raised above first wire bond 100 at step A. At step B1, the wire bonding tool is moved laterally away from first wire bond 100, and at step B2 the wire bonding tool is lowered. Subsequently, the wire bonding tool is raised at step C. Then the wire bonding tool is laterally moved towards a position above first wire bond 100 at step D1, and at step D2, the wire bonding tool is lowered. The downward motion during step D2 is interrupted prior to the wire bonding tool contacting first wire bond 100. Following step D2, a second end of the wire is bonded (after extension of the wire) to a second bonding location (not shown in FIG. 1).

Certain of the motions illustrated in FIG. 1 may be varied while still being within the scope of the present invention. For example, motion B2 may be negated entirely, such that motion B1 (a substantially lateral motion away from first wire bond 100) is followed by motion C. Yet another alternative would be replacing motion B (motion along a downward angle away from first wire bond 100) with a motion along an upward angle away from first wire bond 100.

Further, other combinations of motions illustrated in FIG. 1 are contemplated, for example, (1) motions A, B1, C, and D; (2) A, B1, C, D1, and D2; and (3) A, B, C, D1, and D2. Further still, motion A (a substantially vertical motion) may be replaced by a motion extending along an upward angle away from first wire bond 100. Such a motion could precede any of motion B, B1, or C (in an embodiment where there is no motion corresponding to B or B1). Thus, it is clear that the present invention is not limited to the exemplary embodiments illustrated herein.

In operation, the present invention may be embodied in software of a wire bonding machine. Certain parameters used in connection with the present invention may be set in the software such as distances and directions traveled by a wire bonding tool (e.g., a capillary tool). FIG. 1 illustrates a number of parameters. "Kink Height" relates to the vertical distance traveled during step A. "Reverse Motion" relates to the distance and direction traveled during step B (or steps B1 and B2). "Rmot Angle" relates to the angle between the reverse motion direction and the vertical plane. For example, the Rmot angle between the vertical plane and the direction traveled during step B1 is 90 degrees. Likewise, the Rmot angle between the vertical plane and the direction traveled during step B is approximately 115 degrees. In accordance with the present invention, the Rmot angle could be less than 90 degrees. "Folded Loop Factor" relates to the vertical distance traveled during step C which affects the amount of wire in the to be formed looped portion. It is generally desirable to have less wire in the looped portion to have a lower profile; however, too little wire in the looped portion may produce stress in the looped portion of the wire adjacent thereto. "Fold Distance" relates to the distance and direction traveled during step D (or steps D1 and D2). Because the wire bonding tool is not used to crush the wire bump in accordance with the present invention, a "Fold Height" clearance may be programmed as illustrated in FIG. 1.

Figure 2A:
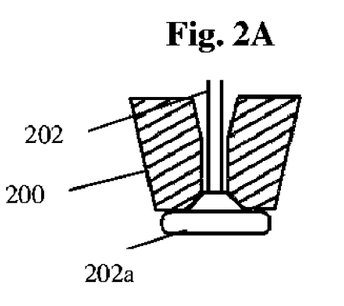
FIGS. 2A-2H are diagrams illustrating a method of bonding a wire between a first bonding location and a second bonding location in accordance with an exemplary embodiment of the present invention.
Figure 2B:
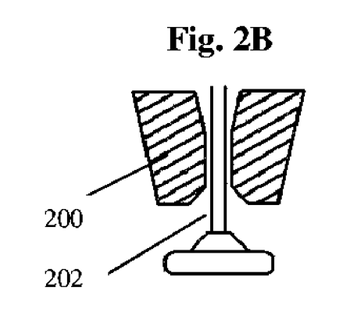
Figure 2C:
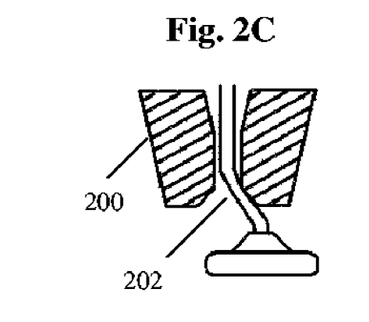
Figure 2D:
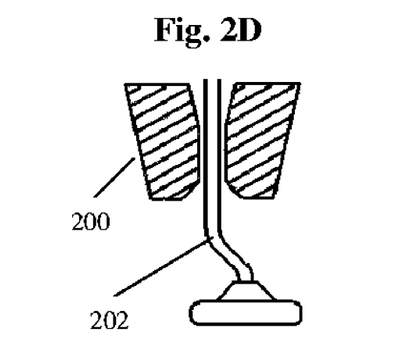
Figure 2E:
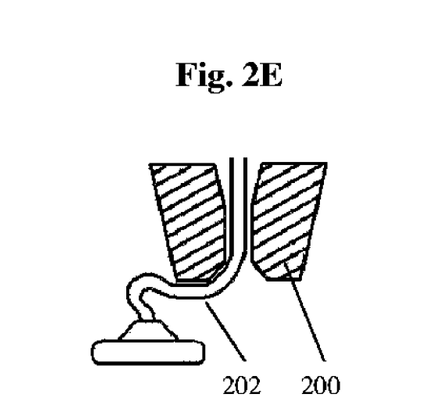
Figure 2F:
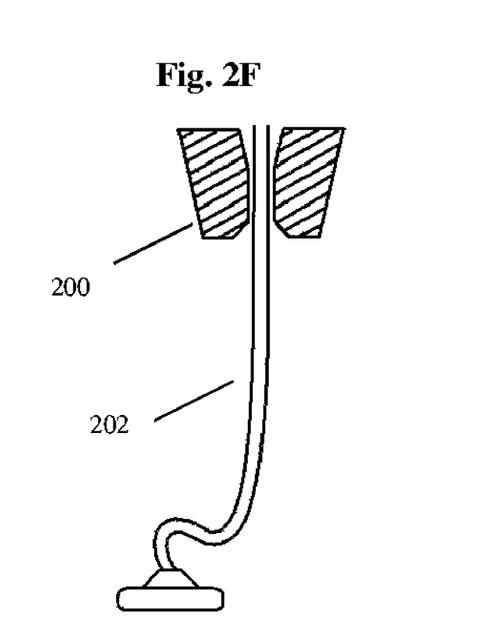
Figure 2G:
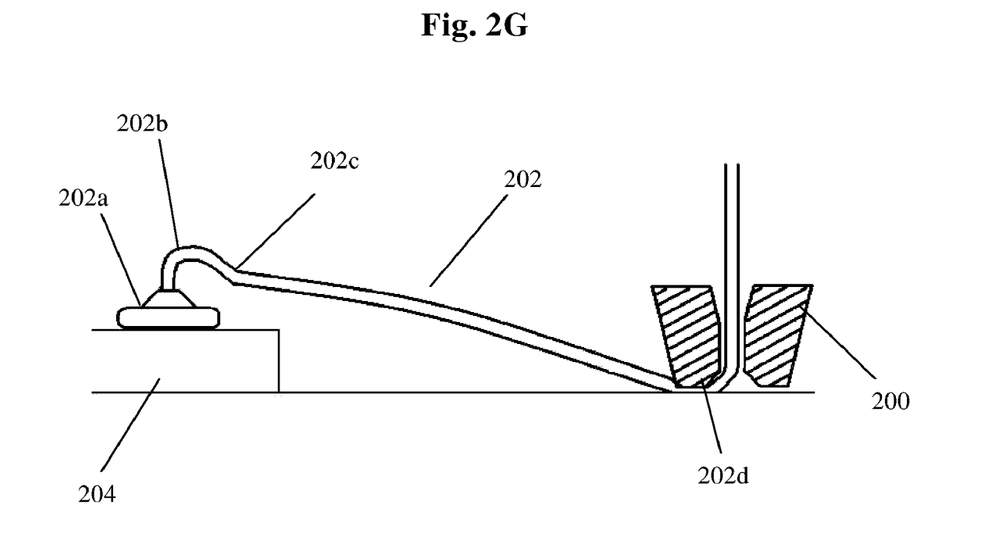
Figure 2H:
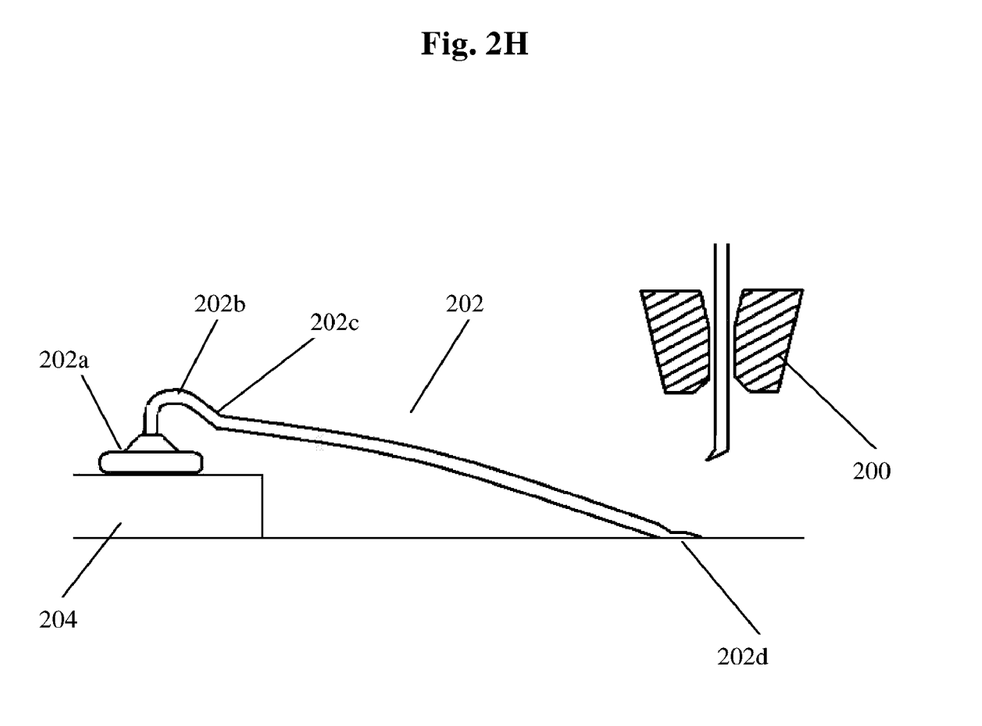

FIGS. 2A-2H are block diagrams illustrating a method of bonding wire 202 between a first bonding location and a second bonding location. FIG. 2A illustrates wire bonding tool 200 (i.e., a capillary tool) for bonding wire 202 between the first bonding location and the second bonding location. In FIG. 2A, wire bump 202a on an end of wire 200 is illustrated as being bonded to the first bonding location (not shown in FIG. 2A, see element 204 of FIG. 2G). Wire bonding tool 200 is then raised in a vertical direction (i.e., the "Kink Height" motion) as illustrated in FIG. 2B. Wire bonding tool 200 then moves laterally away from the first bonding location at FIG. 2C (the "Reverse Motion"), with an Rmot angle of approximately 90 degrees (similar to direction illustrated in connection with step B1 in FIG. 1). In FIG. 2D, wire bonding tool 200 is raised vertically (the "Fold Loop Factor" motion), and in FIG. 2E wire bonding tool 200 is moved along a downward angle towards (and partially past in this embodiment) wire bump 202a (the "Fold Distance" motion). In FIG. 2F, wire bonding tool 200 is raised to allow wire to "payout" of the tool. In FIG. 2G, second end 202d of wire 202 is bonded to a second bonding location, and in FIG. 2H, wire bonding tool 200 is raised, and wire 202 is shown cut and separated from wire bonding tool 200. As shown in FIGS. 2G-2H, wire 202 extending between a first and second bonding location includes wire bump 202a, looped portion 202b, wire kink 202c, and second end 202d.

Figure 3:
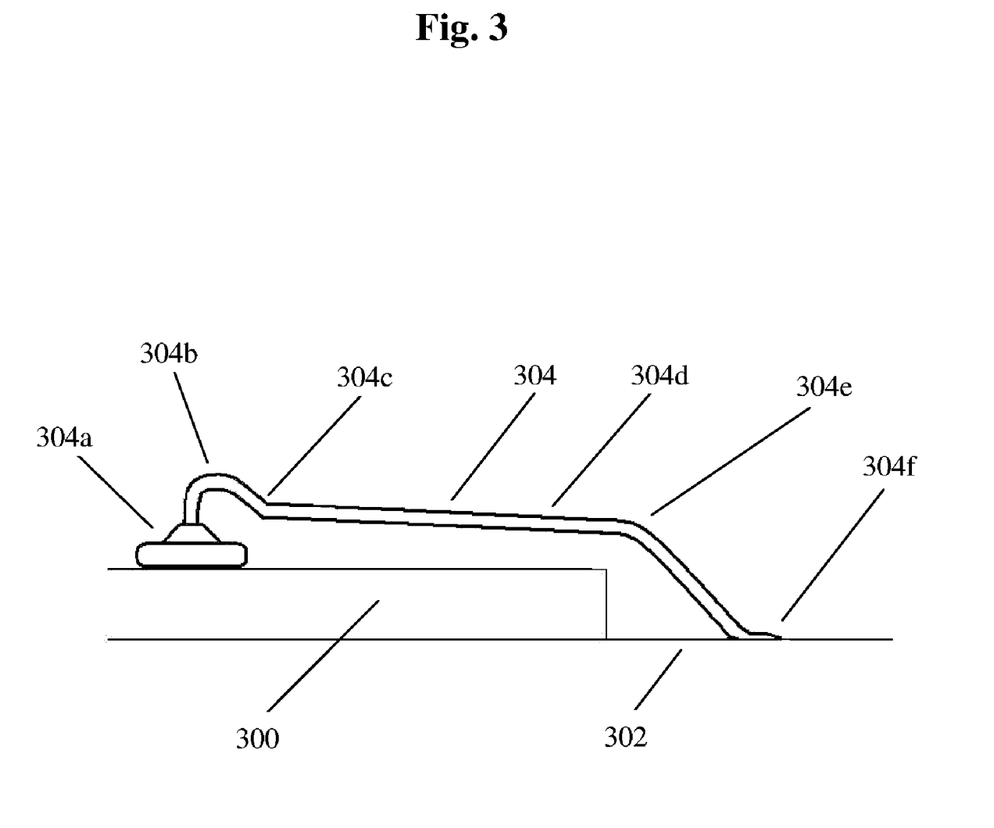
FIG. 3 is an illustration of a wire bond formed in accordance with an exemplary embodiment of the present invention.

FIG. 3 is an illustration of a wire bond 304 formed in a manner similar to wire 202 illustrated in FIG. 2H. More specifically, wire bond 304 extends between a first bonding location (i.e., die 300) and a second bonding location (i.e., leadframe 302). Wire bond 304 includes wire bump 304a (bonded to die 300), looped portion 304b, wire kink 304c, straight portion 304d, wire kink 304e, and second end 304f (bonded to leadframe 302). Wire bond 304 (illustrated in FIG. 3) is different from wire 202 (illustrated in FIG. 2H), for example, because of the inclusion of wire kink 304e (wire 202 includes no such kink). Thus, it is clear that wires bonded according to the present invention may be further shaped as desired.

Figure 4A:
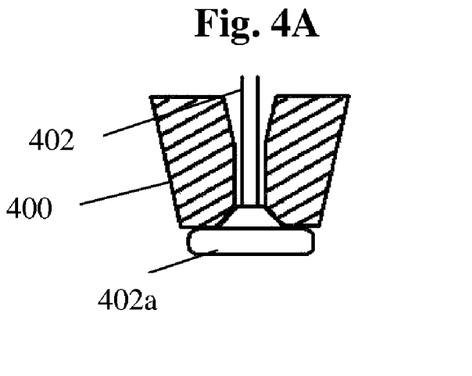
FIGS. 4A-4J are block diagrams illustrating another method of bonding a wire between a first bonding location and a second bonding location in accordance with an exemplary embodiment of the present invention.
Figure 4B:
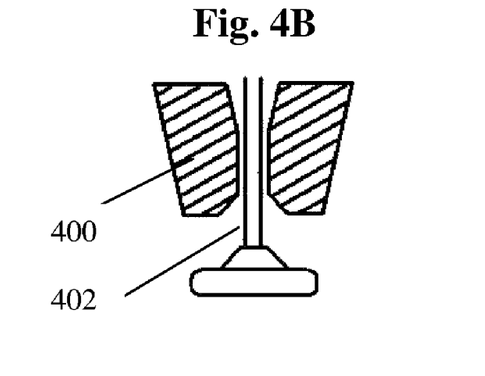
Figure 4C:
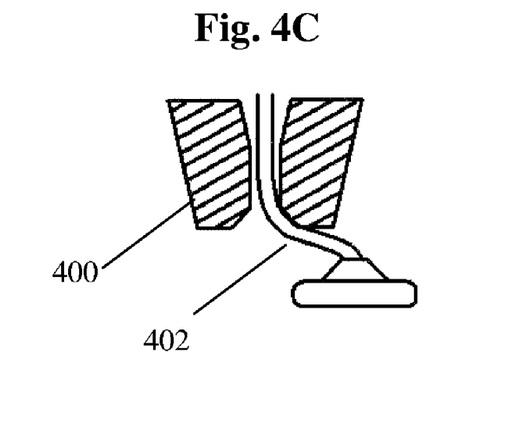
Figure 4D:
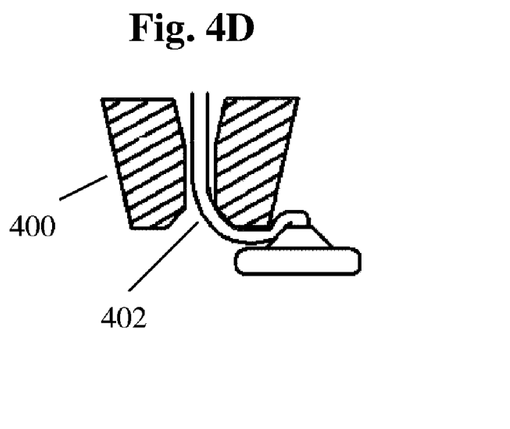

FIGS. 4A-4J are block diagrams illustrating an exemplary method of bonding wire 402 between a first bonding location and a second bonding location. FIG. 4A illustrates wire bonding tool 400 (i.e., a capillary tool) for bonding wire 402 between the first bonding location and the second bonding location. In FIG. 4A, wire bump 402a on an end of wire 400 is illustrated as being bonded to the first bonding location (not shown in FIG. aA, see element 404 of FIG. 4I). Wire bonding tool 400 is then raised in a vertical direction (i.e., the "Kink Height" motion) as illustrated in FIG. 4B. Wire bonding tool 400 then moves laterally away from the first bonding location at FIG. 4C (the "Reverse Motion"), where the lateral motion is increased in comparison to the lateral motion illustrated in FIG. 2C. At FIG. 4D, wire bonding tool 400 is lowered generally towards wire bump 402a. The motion carried out in FIG. 4C has an Rmot angle of approximately 90 degrees. The motions carried out in FIGS. 4C and 4D may be carried out by a single motion in a direction along a downward angle (e.g., an Rmot angle in excess of 90 degrees), such as that illustrated and described above with respect to motion B in FIG. 1.

Figure 4E:
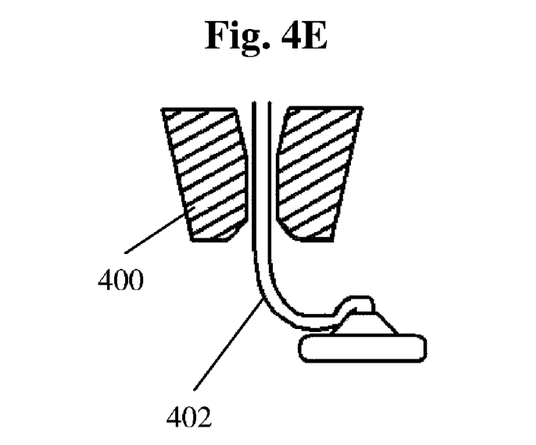
Figure 4F:
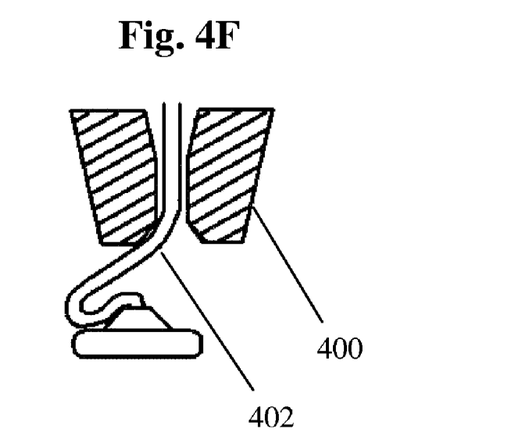
Figure 4G:
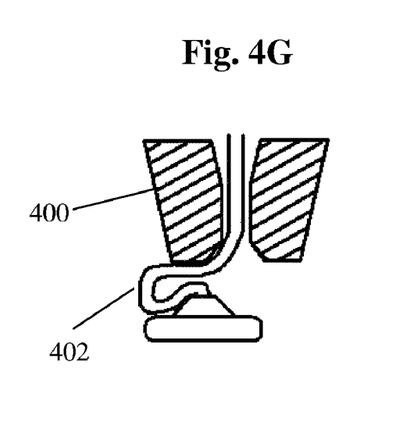

In FIG. 4E, wire bonding tool 400 is raised vertically (the "Fold Loop Factor" motion), and in FIG. 4F wire bonding tool 400 is moved towards (and partially past in this embodiment) wire bump 402a (the "Fold Distance" motion). At FIG. 4G, wire bonding tool 400 is lowered generally towards wire bump 402a. The motions carried out in FIGS. 4F and 4G may be carried out by a single motion in a direction along a downward angle, such as that illustrated and described above with respect to motion D in FIG. 1.

Figure 4H:
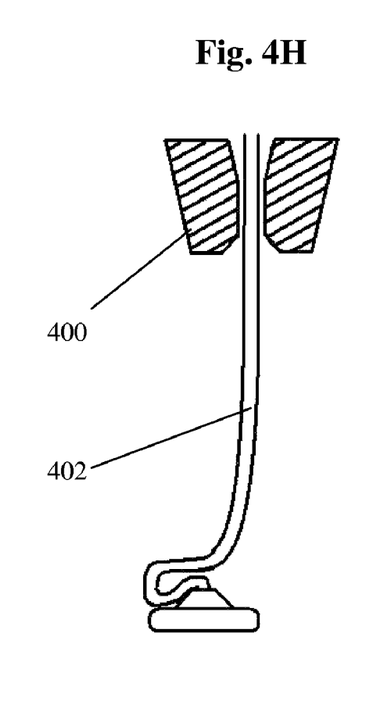
Figure 4I:
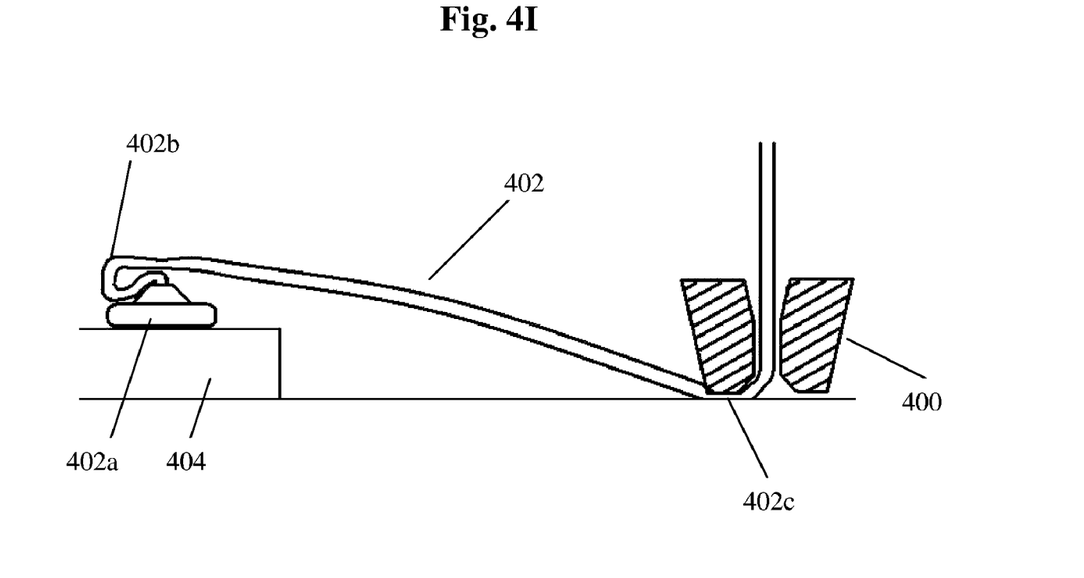
Figure 4J:
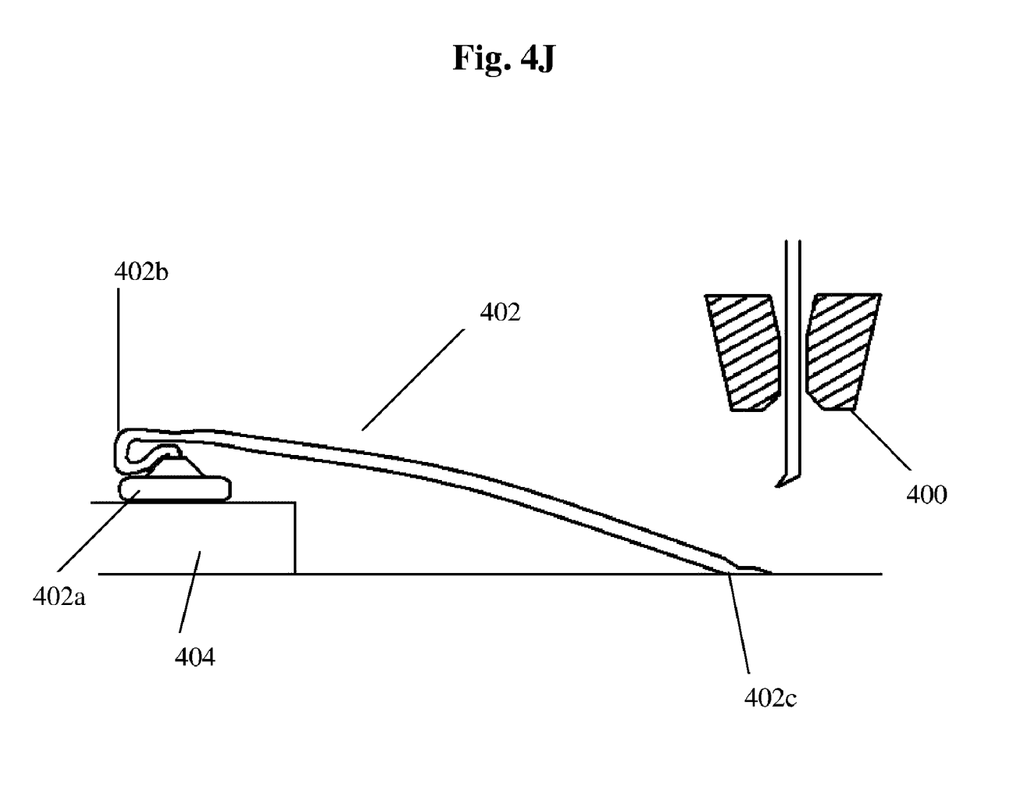

In FIG. 4H, wire bonding tool 400 is raised to allow wire to "payout" of the tool. In FIG. 4I, second end 402c of wire 402 is bonded to a second bonding location, and in FIG. 4J, wire bonding tool 400 is raised, and wire 402 is shown cut and separated from wire bonding tool 400. As shown in FIGS. 4I-4J, wire 402 extending between a first and second bonding location includes wire bump 402a, looped portion 402b, and second end 402c.

Figure 5:
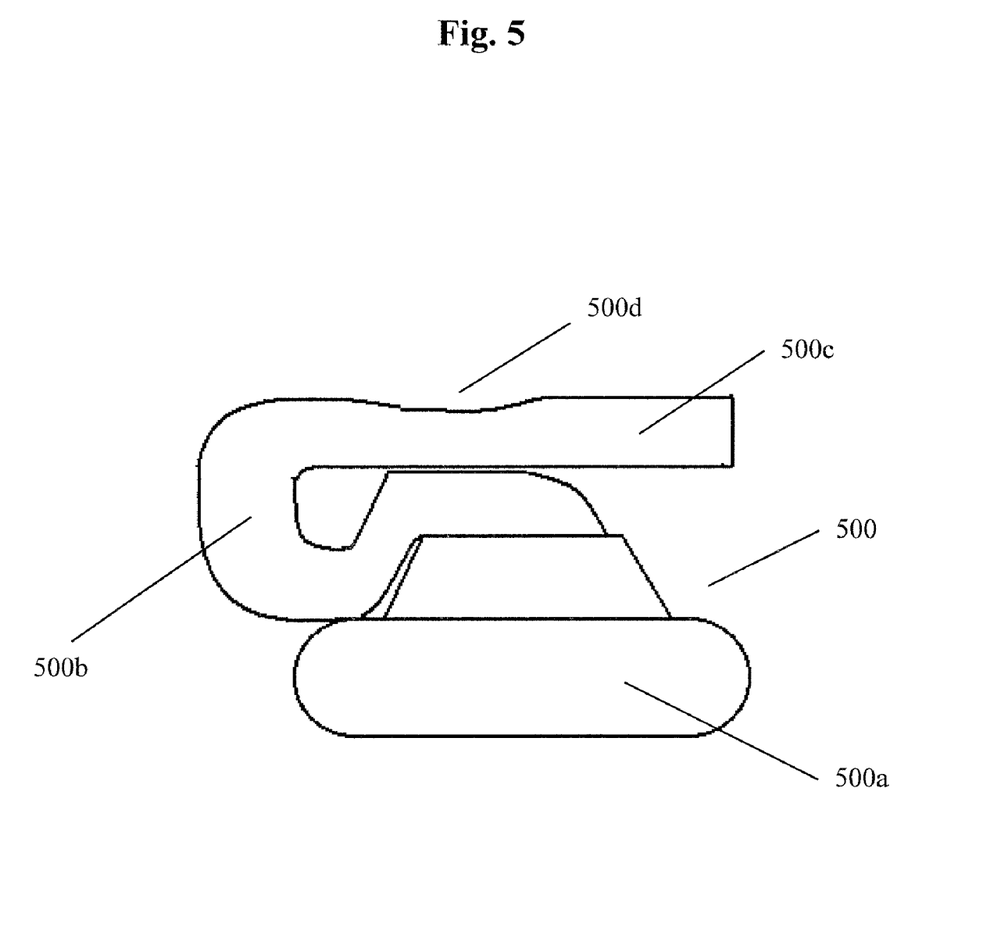
FIG. 5 is an illustration of a looped portion of a wire formed in accordance with an exemplary embodiment of the present invention.

FIG. 5 is an illustration of a portion of a wire 500 formed in a manner similar to that illustrated and described above with respect to FIGS. 4A-4J. The illustrated portion of wire 500 includes wire bump 500a, looped portion 500b, and straight portion 500c. Because of the way in which looped portion 500b was formed (which is similar to the method illustrated in FIGS. 4A-4J), a portion of wire 500 (recessed portion 500d) has collapsed to be in contact with (or in virtual contact with another portion of wire 500. This "collapse" results partially from the amount of wire "payout" during the loop formation, and partially as a result of the motion used to form the wire loop. Further, this "collapse" is very desirable because wire 500 has a very low profile, without having been "crushed" by a wire bonding tool.

The wire bonding techniques of the present invention may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the wire bonding techniques.

The wire bonding techniques disclosed herein provide an additional benefit in that the portion of wire above the first bond may be stiffer than the corresponding portion of conventional wire bonds, at least partially because of the reduced profile or height. Such stiffening may desirably result in a decrease in wire sweep.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of bonding a wire between a first bonding location and a second bonding location, the method comprising the steps of:

bonding a first end of a wire to a first bonding location using a wire bonding tool to form a first wire bond;

forming a fold of wire on top of, and in contact with, the first wire bond such that the fold of wire includes (1) a first portion extending from the first wire bond in a first direction, (2) a second portion extending in a second direction substantially opposite and substantially parallel to the first direction;

lowering the wire bonding tool in a direction towards the first wire bond immediately after the forming step, the lowering step being interrupted prior to the wire bonding tool contacting the first wire bond such that the bonding tool does not bond the fold of wire to the first wire bond; and bonding a second end of the wire to a second bonding location.

2. The method of claim 1 wherein the step of lowering includes lowering the wire bonding tool in the direction towards, but to a side of, the first wire bond.

3. The method of claim 1 wherein the step of forming includes:

raising the wire bonding tool above the first wire bond, laterally moving the wire bonding tool away from the first wire bond, lowering the wire bonding tool, raising the wire bonding tool, and laterally moving the wire bonding tool towards a position above the first wire bond.

4. The method of claim 1 wherein the step of forming includes:

raising the wire bonding tool above the first wire bond, laterally moving the wire bonding tool away from the first wire bond, raising the wire bonding tool, and laterally moving the wire bonding tool towards a position above the first wire bond.

5. The method of claim 1 wherein the step of forming includes:
raising the wire bonding tool above the first wire bond,
laterally moving the wire bonding tool away from the first wire bond,
raising the wire bonding tool, and
moving the wire bonding tool along a downward angle towards a position above the first wire bond.

6. The method of claim 1 wherein the step of forming includes:
raising the wire bonding tool above the first wire bond,
moving the wire bonding tool along a downward angle away from the first wire bond,
raising the wire bonding tool, and
laterally moving the wire bonding tool towards a position above the first wire bond.

7. The method of claim 1 wherein the step of forming includes:
raising the wire bonding tool above the first wire bond,
moving the wire bonding tool along a downward angle away from the first wire bond,
raising the wire bonding tool, and
moving the wire bonding tool along another downward angle towards a position above the first wire bond.

8. The method of claim 1 wherein the step of forming includes:
moving the wire bonding tool along an upward angle away from the first wire bond, and laterally moving the wire bonding tool towards a position above the first wire bond.

9. The method of claim 1 wherein the step of forming includes:
moving the wire bonding tool along an upward angle away from the first wire bond, and
moving the wire bonding tool along another upward angle towards a position above the first wire bond.

10. A method of bonding a wire between a first bonding location and a second bonding location, the method comprising the steps of:
bonding a first end of a wire to a first bonding location using a wire bonding tool to form a first wire bond;
forming a fold of wire on top of, and in contact with, the first wire bond such that the fold of wire includes (1) a first portion extending from the first wire bond in a first direction, (2) a second portion extending in a second direction substantially opposite and substantially parallel to the first direction, the step of forming including in order:
raising the wire bonding tool above the first wire bond,
moving the wire bonding tool away from the first wire bond,
raising the wire bonding tool, and
moving the wire bonding tool towards the first wire bond, the moving step being interrupted prior to the wire bonding tool contacting the first wire bond such that the bonding tool does not bond the fold of wire to the first wire bond; and
bonding a second end of the wire to a second bonding location.

11. The method of claim 10 wherein the step of moving the wire bonding tool away from the first wire bond includes moving the wire bonding tool along a downward angle away from the first wire bond.

12. The method of claim 10 wherein the step of moving the wire bonding tool away from the first wire bond includes laterally moving the wire bonding tool away from the first wire bond.

13. The method of claim 10 wherein the step of moving the wire bonding tool towards the first wire bond includes moving the wire bonding tool along a downward angle towards the first wire bond.

14. The method of claim 10 wherein the step of moving the wire bonding tool towards the first wire bond includes laterally moving the wire bonding tool towards the first wire bond.

* * * * *